United States Patent
Yamazaki et al.

(10) Patent No.: US 6,543,033 B2
(45) Date of Patent: Apr. 1, 2003

(54) CIRCUIT DESIGN APPARATUS, CIRCUIT DESIGN METHOD, CIRCUIT DESIGN PROGRAM AND SEMICONDUCTOR INTEGRATED CIRCUIT FABRICATION METHOD

(75) Inventors: Itaru Yamazaki, Minato-ku (JP); Nobuyuki Ikumi, Minato-ku (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 9 days.

(21) Appl. No.: 09/816,244

(22) Filed: Mar. 26, 2001

(65) Prior Publication Data
US 2001/0025366 A1 Sep. 27, 2001

(30) Foreign Application Priority Data
Mar. 27, 2000 (JP) .................... 2000-087664

(51) Int. Cl.[7] .............................. G06F 17/50
(52) U.S. Cl. ................................. 716/2; 716/6
(58) Field of Search ..................... 716/2, 8, 9, 10, 716/11, 12, 13, 14, 1, 3, 4, 5, 6, 7

(56) References Cited

U.S. PATENT DOCUMENTS

| | | | | | |
|---|---|---|---|---|---|
| 5,787,268 A | * | 7/1998 | Sugiyama et al. | .......... | 395/500 |
| 5,892,685 A | * | 4/1999 | Sugiyama et al. | .......... | 364/490 |
| 6,009,248 A | * | 12/1999 | Sato et al. | ............. | 395/500.03 |
| 6,090,150 A | * | 7/2000 | Tawada | ....................... | 703/19 |
| 6,148,432 A | * | 11/2000 | Brown | .......................... | 716/1 |
| 6,308,305 B1 | * | 10/2001 | Sugiyama et al. | ............. | 716/6 |
| 6,412,101 B1 | * | 6/2002 | Chang et al. | .................. | 716/10 |

FOREIGN PATENT DOCUMENTS

JP    10-21289    1/1998

* cited by examiner

Primary Examiner—Tuan T. Lam
Assistant Examiner—Hai L. Nguyen
(74) Attorney, Agent, or Firm—Oblon, Spivak, McClelland, Maier & Neustadt, P.C.

(57) ABSTRACT

In a circuit design method, an arrangement/wiring section (112) determines an arrangement and wiring of logical blocks (40a, 40b, 40c, 40d) so that delay limitation information about input signals supplied to the logical blocks (40a, 40b, 40c, 40d) and limitation conditions about a difference of delay times among a pre-charge control signal (ck0, ck1, ck2) supplied to the corresponding logical lock (40a, 40b, 40c, 40d) and the input signals are satisfied.

19 Claims, 7 Drawing Sheets

CIRCUIT DESIGN APPARATUS, CIRCUIT DESIGN METHOD, CIRCUIT DESIGN PROGRAM AND SEMICONDUCTOR INTEGRATED CIRCUIT FABRICATION METHOD

CROSS-REFERENCE TO RELATED APPLICATION

This application claims benefit of priority under 35 U.S.C. §119 to Japanese Patent Application No. 2000-87664, filed on Mar. 27, 2000, the entire contents of which are incorporated herein by reference herein.

BACKGROUND OF THE INVENTION

1. Field of the Invention

The present invention relates to a circuit design apparatus, a circuit design method, and a circuit design program for automatically generating arrangement/wiring information of logical blocks in a circuit by using design information about the circuit, and a semiconductor for integrated circuit fabrication method of fabricating a semiconductor integrated circuit based on the arrangement/wiring information, and, more particularly, to a technique to increase the efficiency of the circuit design and of the semiconductor int grated circuit fabrication process significantly.

2. Description of the Related Art

At present, there are various methods and configuration techniques to increase the operation speed of a semiconductor integrated circuit. How ver, the performance of the semiconductor integrated circuit is often extremely decreased or the circuit characteristic is to be required cannot be often achieved under the relationship of delays among input signals supplied to logical blocks in the circuit to be design. In order to avoid those cases, the designer must handle a part of the design process of the circuit by manual.

For example, in order to drive the circuit under optimum state, the designer must set various kinds of conditions. For example, following conditions must be necessary:

An evaluation of a logical block must be initiated after the level of a clock signal clock signal ck is switched and the transmission of an input signal from a preceding logical block to a node in a following logical block is also completed simultaneously; and The evaluation of the following logical block must be completed adequately before a pre-charging for the preceding block in a preceding stage by a following clock signal is initiated.

However, in the conventional timing design process for such the case, the designer must adjust the circuit parameters only by manual in order to drive the circuit in the optimum state.

Accordingly, it is extremely difficult for the designer to design the optimum arrangement in the target circuit having the highest performance, because such the conventional circuit design method requires consideration of both the logical delay and the wiring delay estimated from the arrangement of logical blocks in a final circuit layout. Further, the conventional circuit design method by manual requires a long design time period. This causes to decrease the efficiency of the circuit design process.

In order to avoid this conventional drawback of the circuit design described above, it s possible to use a CAD (Computer Aided Design) technique. However, although the conventional CAD technique can design a circuit so that a clock signal is transferred to each logical block simultaneously, it cannot delay the clock signal in consideration of the relationship between the input signal supplied to the logical block and the clock signal. Accordingly, it is difficult to perform a circuit design with high accuracy.

SUMMARY OF THE INVENTION

Accordingly, an object of the present invention is, with due consideration to the drawbacks of the conventional technique, to provide a circuit design apparatus, a circuit design method, a circuit design program, and semiconductor integrated circuit fabrication method capable of extremely increasing the efficiency of a circuit design process with high accuracy.

The inventors have deduced a new idea from the consideration of the delay of input signals to be supplied into logical blocks in a target circuit to be design. That is, the inventors have obtained the resent invention to increase the efficiency of the circuit sign process when the automatic arrangement/wiring process s performed so that the difference of delay times among the input signals to be input to the logical blocks is set in limitation conditions and a clock signal to be supplied to the logical blocks is delayed. The inventors have invented the technical idea including the following features based on the result of a continuous aggressive study.

In accordance with a preferred embodiment of the present invention, a circuit design apparatus determines an arrangement and wiring of logical blocks n a circuit by using circuit design information. The circuit design apparatus comprises an arrangement/wiring section or determining an arrangement and wiring of the logical blocks in the circuit so that both delay limitation information about input signals to be supplied to the logical blocks and limitation conditions about a difference of delay times among a pre-charge control signal to be supplied to the corresponding logical block and the input signals are satisfied.

In accordance with another preferred embodiment of the present invention, a circuit design method determines an arrangement and wiring of logical blocks in a circuit by using circuit design information. The circuit design method includes the steps of: inputting delay limitation information about input signals to be supplied to the logical blocks and limitation conditions about a difference of delay times among a pre-charge control signal to be supplied to the corresponding logical block and the input signals; and determining the arrangement and the wiring of the logical block in the circuit so that both the delay limitation information and the limitation conditions are satisfied.

In accordance with another preferred embodiment of the present invention, a circuit design program to be used for executing a circuit design method of determining an arrangement and wiring of logical blocks in a circuit by using circuit design information. The circuit design program includes the programs of: inputting delay limitation information about input signals to be supplied to the logical blocks and limitation conditions about a difference of delay times among a pre-charge control signal to be supplied to the corresponding logical block and the input signals; and determining the arrangement and the wiring of the logical blocks in the circuit so that both the delay limitation information and the limitation conditions are satisfied.

According to the circuit design apparatus, the circuit design method and the circuit design program of the present invention, it is possible to perform the circuit design process automatically to design circuits of higher speed operation, a part of which is designed by manual in the prior technique, by the automatic arrangement/wiring process. In addition, it is also possible to extremely improve the efficiency of the circuit design process.

In accordance with another preferred embodiment of the present invention, a semiconductor integrated circuit fabrication method fabricates a semiconductor integrated circuit. This fabrication method comprises the steps of: the step of inputting circuit design information that are obtained by determining an arrangement and wiring of logical blocks so that the following delay limitation information and limitation conditions are satisfied; and the step of fabricating the semiconductor integrated circuit by performing the arrangement and wiring of the logical blocks based on the circuit design information. In this case, the delay limitation information is the information about input signals to be supplied to the logical blocks, and the limitation conditions are the conditions about a difference of delay times among a pre-charge control signal to be supplied to the corresponding logical block and the input signals.

Thereby, it is possible to perform the circuit design process efficiently and also to reduce the fabrication process period of the semiconductor integrated circuit.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.
First Embodiment.

Hereinafter, a description will be given of the detail explanation of the circuit design apparatus, the circuit design method, the circuit design program, and the semiconductor integrated circuit fabrication method.

Figure 1A:
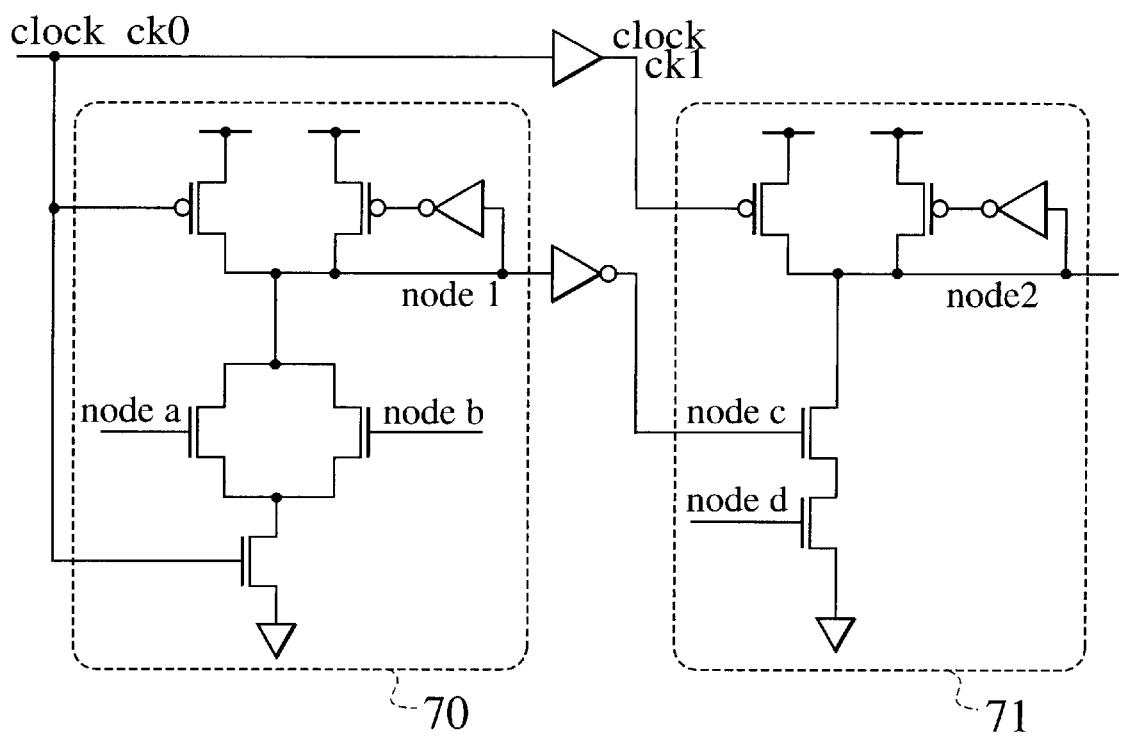
FIGS. 1A and 1B are block diagrams for explaining a circuit design process.
Figure 1B:
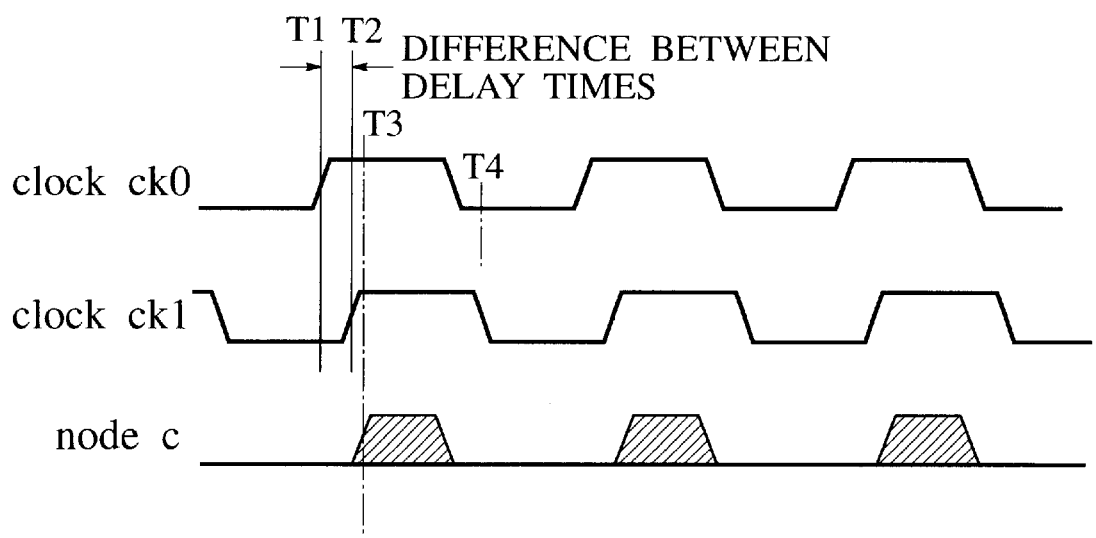

Recently, in order to drive the circuit with high speed, the circuit design uses circuits shown in FIGS. 1A and 1B, for example. However, in general, the designer handles a part of the design process of the circuit by manual because there is a possibility to extremely decrease the performance of the circuit or not to obtain a desired circuit characteristic based on the magnitude of delay among input signals to be supplied to logical blocks in the circuit.

In the circuit show in FIG. 1A as a concrete example, various setting conditions must be necessary in order to drive the circuit under the optimum timing condition. For example, following conditions must be required:

As shown in FIG. 1B, an evaluation of a logical block 71 must be initiated after the, level of the clock signal "ck1" is switched and the transfer of the signal from the logical block 70 to the node "c" in the logical block 71 is also completed simultaneously (see Timing T3 in FIG. 1B); and The evaluation of the logical block 71 has been completed adequately before the pre-charging for the logical block 70 in a preceding stage by a following clock cycle is initiated (see Timing T4 in FIG. 1B) by the following clock signal ck0, that is, it is necessary that the value at the node 2 is established.

The circuit designer adjusts the operation timings of the logic blocks in the target circuit by manual in order to drive the circuit under the opts um condition. In such the case of the circuit design method, it is extremely difficult only for the designer to design the optimum arrangement in the target circuit having the highest performance, because such the circuit design method requires consideration of both the logical delay and the wiring delay estimated from the arrangement of logical blocks in a final circuit layout. Further, the circuit design method performed by manual requires a long design time period. This causes to decrease the efficiency of the circuit design process.

The circuit design apparatus, the circuit design method, the circuit design program according to the present invention, that will be described below, can execute arrangement/wiring process automatically by sing limitation information among clock signals and input signals to be supplied to logical blocks in a target circuit to be design. For example, it is thereby possible to increase the of efficiency and accuracy of the circuit design and to design a circuit using high-speed logical blocks easily.
Circuit Design Apparatus FIG. 2 is a block diagram showing a configuration of the circuit design apparatus according to a preferred embodiment of the present invention.

Figure 2:
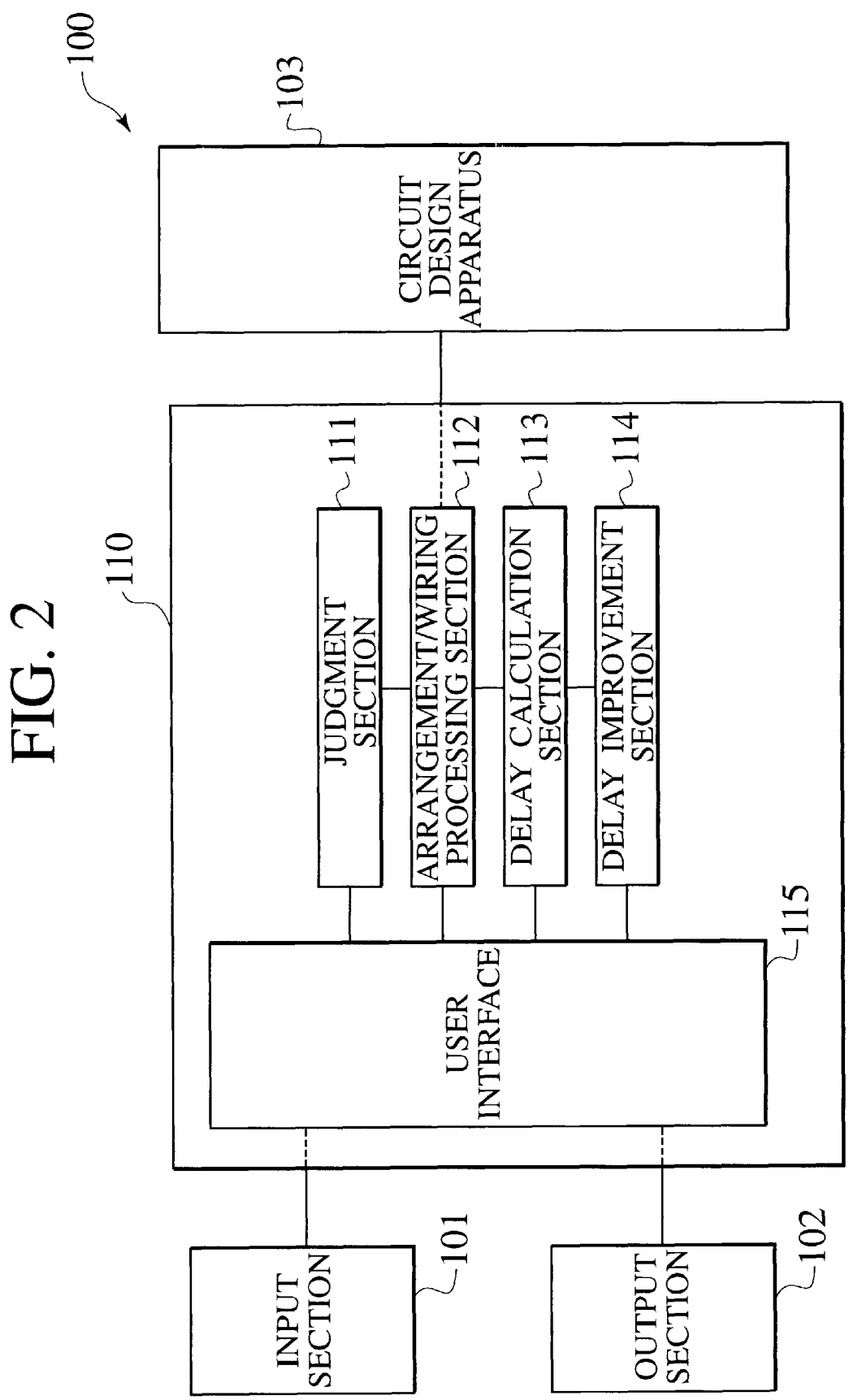
FIG. 2 is a block diagram showing a configuration of a circuit design apparatus according to a preferred embodiment of the present invention.

As shown in FIG. 2, the circuit design apparatus 110 forms a semiconductor integrate circuit fabrication system 100 connecting a semiconductor integrated circuit fabrication apparatus 103 for fabricating g semiconductor integrated circuits by using arrangement and wring information of logical blocks in a circuit to be designed.

This circuit design apparatus 110 comprises a judgment section 111, an arrangement/wiring processing section 112, a delay calculation section 113, a delay improvement section 114, and a user interface sect on 115. The judgment section 111 performs various judgments whether error operation occurs based on the timing of input signals to be supplied to logical blocks in the target circuit to be design, whether a calculated delay value satisfies a corresponding limitation condition, whether a clock signal is delayed correctly, and so on. The arrangement/wiring processing section 112 performs an arrangement and wiring process for the logical blocks in the target circuit. The delay calculation section 113 calculates a delay time of each of the input signals and the clock signal to be supplied to the logical blocks. The delay improvement section 114 changes the circuit design information so that the delay time of each input signal is set in the corresponding limitation condition and the clock signal is correctly delayed. The user interface section 11 helps the control for the operation of each component in the circuit design apparatus 110 described above.

The circuit design apparatus 110 of the preferred embodiment is connected to an input section 101 and an output section 102. The designer inputs various kinds of input information such as the circuit design information, the control information, and other information for the circuit design apparatus 110 through the input section 101, for example, a keyboard, a mouse pointer, and the like. The designer receives various kinds of output information such as the arrangement/wiring information and error information about the target circuit through the output section 102, for example, a display, a printer, and the like.

Figure 3:
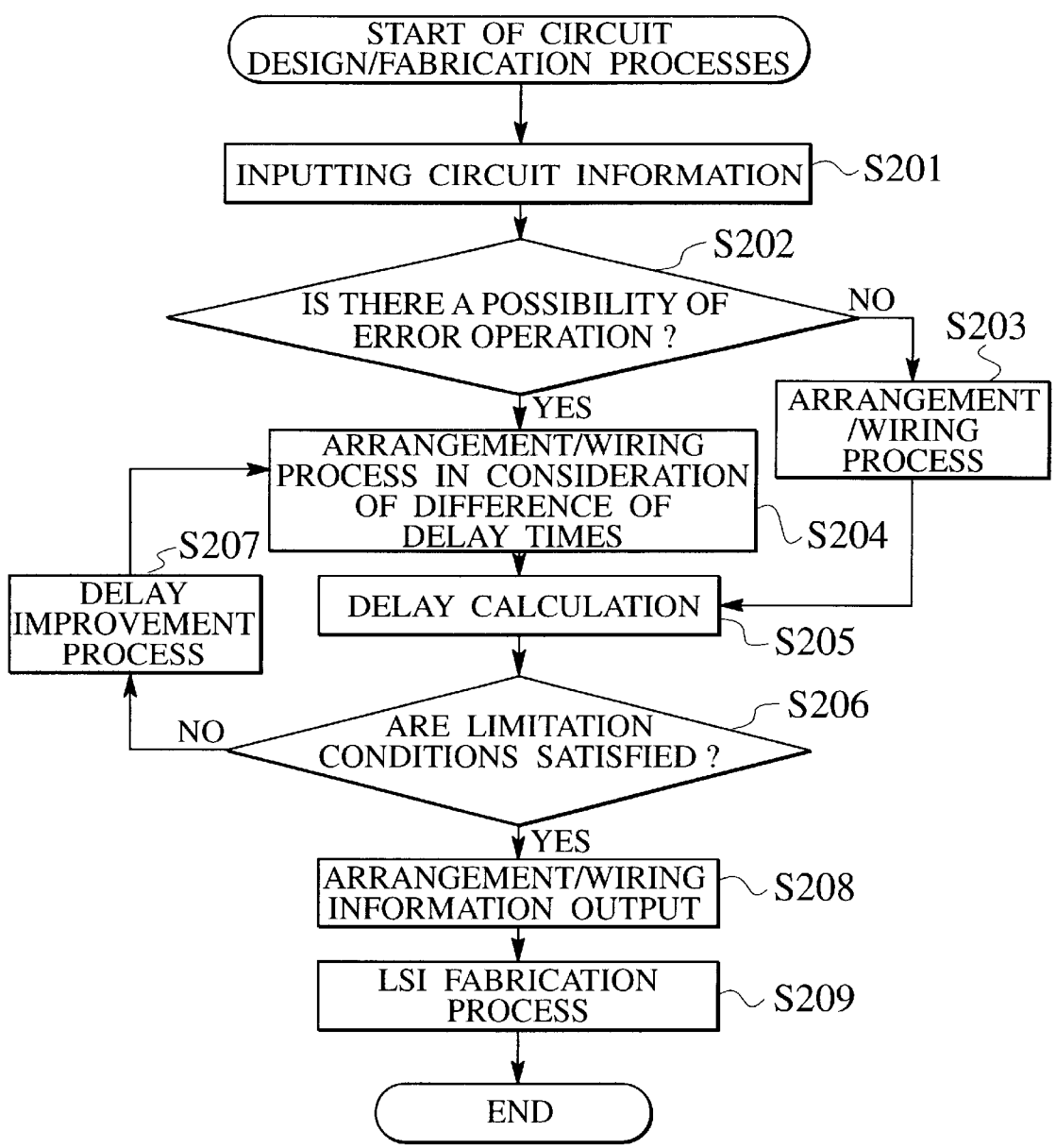
FIG. 3 is a flow chart showing the process of a circuit design method of the preferred embodiment of the present invention.

Circuit Design Method and Fabrication Method and Semiconductor Integrated Circuit Fabrication Method FIG. 3 is a flow chart showing the process of the circuit design method of the preferred embodiment of the present invention.

The circuit design method of the preferred embodiment performs the following step (1) Firstly, logical connection information, delay limitation information (a), limitation condition (b) for the difference of delay times among input signals, and delay time information of the logical blocks and signal lines are provided into the circuit design apparatus 110 through the input section 101 (Step S201 of inputting circuit design information).

In this case, the delay limitation information (a) means the limitation for a signal delay that must be satisfied in the connection between logical blocks.

The limitation condition (b) for the difference of the delay times among input signals means the limitation to the difference of delay times generated between two or more signal lines in logical blocks in which signal lines are electrically wired. An example of the limitation is as follows:

(Delay time of signal 1)–(Delay time of signal 2)>100 [psec]; and

20[psec]<(Delay time of 1)–(Delay time of signal 2)<100 [psec].

(2) Secondly, the judgment section 111 judges whether the timing of the input signal supplied to the logical block in the target circuit to be design causes an error operation or not (Step S202 of performing judgment about the occurrence of an error operation).

When a result of the judgment indicates that an error operation will occur, the operation flow goes to Step 5204 of performing the arrangement/wiring process in consideration of the difference between delay times.

On the other hand, when the result indicates that no error operation will occur, the operation flows goes to Step 5203 of performing the arrangement/wiring process.

(3) The arrangement/wiring processing section 112 performs the arrangement process and the wiring process by using the limitation conditions in the delay limitation information (a) (Step S202 of performing the arrangement/wiring process), and the operation flow then goes to Step 5205 of performing the delay calculation process.

(4) The arrangement/wiring processing section 112 performs the arrangement/wiring process based on the delay limitation information (a) and the limitation conditions (b) for the difference of delay times among input signals (Step S204 of performing the arrangement/wiring process in consideration of the difference between delay times).

(5) The delay calculation section 113 calculates the delay time of each signal and each clock signal to be transferred from/to each logical block in consideration of the logical connection information, the result of the arrangement/wiring process, and a coupling capacity (Step 205 of calculating a delay time).

(6) The judgment section 111 firstly refers the delay limitation information (a) and the limitation conditions (b) for the difference of delay times among input signals, and then judges whether the delay value of a signal calculated by the delay calculation section 113 satisfies both the delay limitation information (a) and the limitation conditions (b) and whether the clock signal is correctly delayed (Step S206 of performing the judgment of the limitation condition).

When the result of the judgment indicates that the delay value of the signal satisfies both the delay limitation information (a) and the limitation conditions (b), the operation flow goes to Step S208 of outputting the arrangement/wiring information. On the other hand, when the result of the judgment indicates it does not satisfy both the delay limitation information (a) and the limitation conditions (b), the operation flows goes to Step 5207 of performing a delay improvement process.

(7) The delay improvement section 114 changes the circuit design information so that the delay value of the signal satisfies both the delay limitation information (a) and the limitation conditions (b), and the clock signal is correctly delayed (Step S207 of performing the delay improvement process). After this process, the operation flow goes to Step S204 of performing the arrangement/wiring process in consideration of the delay time.

In the above process, the delay improvement section 114 inserts a delay element such as a delay cell and performing the re-arrangement for the to logical blocks in a path that requires an additional delay time. Further, the delay improvement section 114 deletes a delay element and also changes the arrangement of the logical blocks in path that requires the deletion of the delay time. Furthermore, it is preferably to delay the propagation time of the signal in a clock system from the consideration of the relationship between the propagation delay time of the signal in the clock system and the propagation delay time of the signal to be supplied to the logical block. In this case, there is a pre-charge signal and the like as the signal in the clock system. Furthermore, it is possible to decrease a coupling capacity by the delay improvement process.

(8) When all limitations are satisfied, the circuit design apparatus 110 outputs the arrangement/wiring information to the semiconductor integrated circuit fabrication apparatus 103 (Step 5208 of outputting the arrangement/wiring information). The semiconductor integrated circuit fabrication apparatus 103 thereby designs a mask pat-tern based on the arrangement/wiring information from the circuit design apparatus 110 (Step S209 of performing the semiconductor integrated circuit fabrication process).

Figure 4:
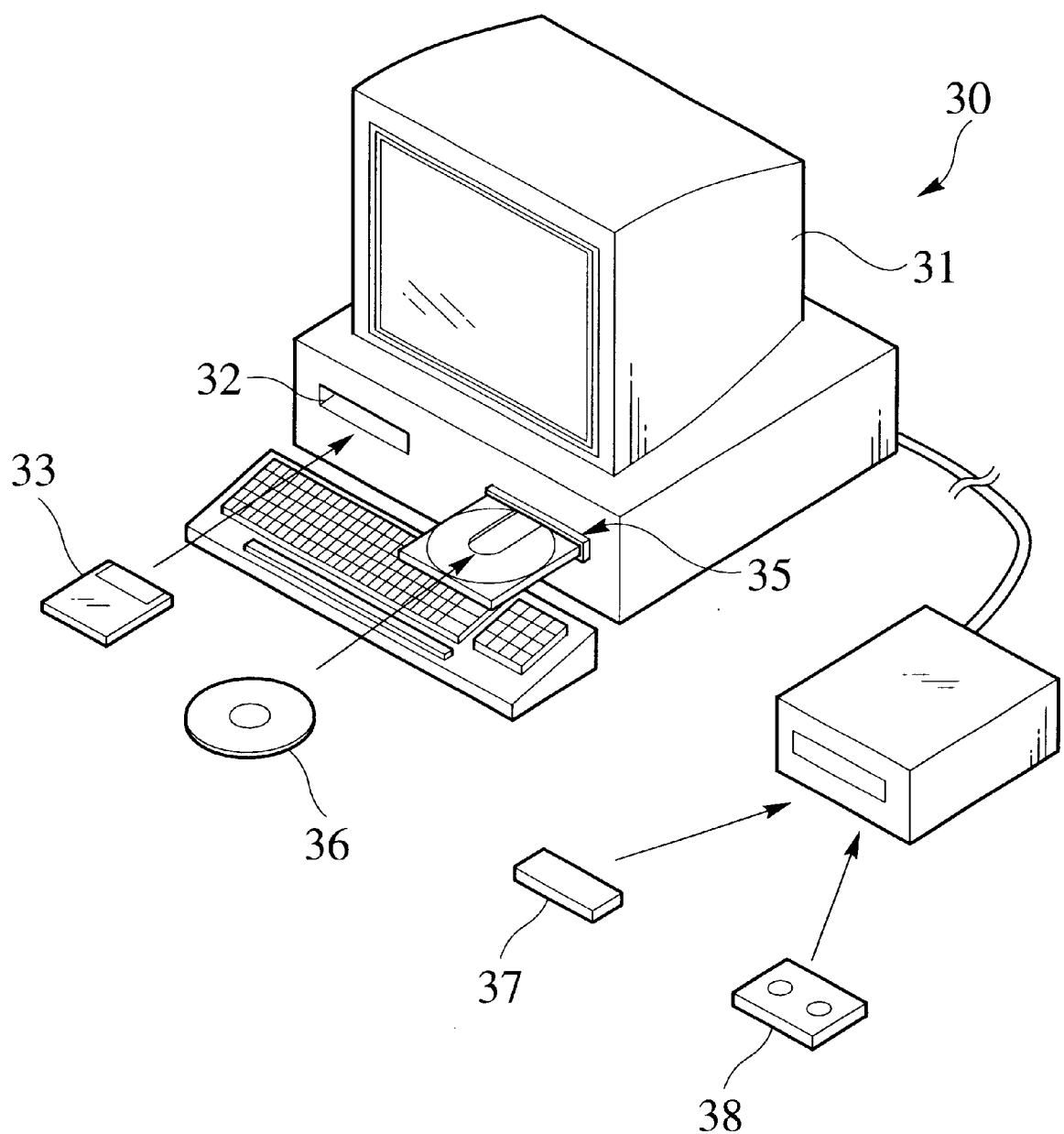
FIG. 4 is a schematic diagram showing the entire of the circuit design apparatus according to the preferred embodiment of the present invention.

FIG. 4 is a schematic diagram showing an example of the entire aspect of the circuit design apparatus according to the preferred embodiment of the present invention.

Each component in the circuit design apparatus of the preferred embodiment of the present invention is incorporated into a computer system 30 shown in FIG. 4. This computer system 30 comprises a floppy disk drive 32 and an optical disk drive 35.

The designer insert a floppy disk into the floppy disk drive 32 and an optical disc into the optical disk drive 35, and the designer operates some necessary operations, and the computer system 70 thereby installs a circuit design program stored in the floppy disk and the optical disk. In addition, it is also possible to install the circuit design program into the computer system 70 by connecting an available drive device such as a ROM 37 as a memory device or a cartridge 38 as a magnetic tape device with the computer system 70.

Furthermore, it is possible to store the circuit design program of the present invention into a recording medium that is readable by a computer system. In the use of the circuit design program, the computer system firstly reads this recording medium in order to store the circuit design program into a memory in the computer system, and the circuit design program is then executed. This means to realize the circuit design method, the circuit design apparatus on an available computer system. In this case, the recording medium means an computer readable medium or a communication medium for signals, for example, a semiconductor memory, a magnetic disc, an optical disc, a magneto-optical disc, a magnetic tape, a digital video disk, and so on.

EXAMPLE OF EXPERIMENT description will be given of the explanation of the circuit design process for two circuits based on the circuit design method and the circuit design apparatus according to the present invention.

Figure 5:
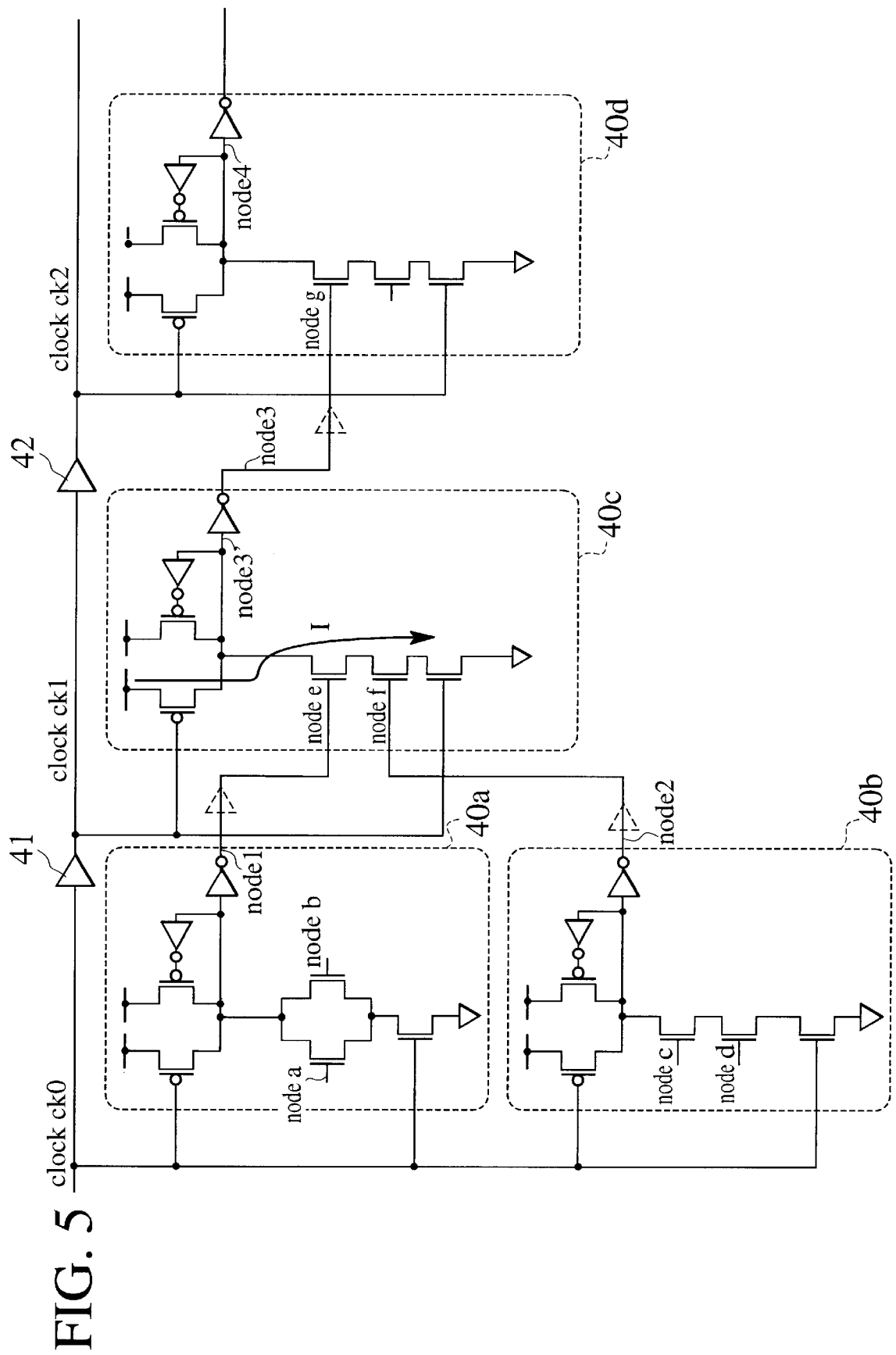
FIG. 5 is a diagram showing an example of a target circuit to be designed by the circuit design method according to the preferred embodiment of the present invention.

FIG. 5 is a diagram showing an example of a circuit to be designed by the circuit design method according to the preferred embodiment of the present invention.

In the circuit shown in FIG. 5, for example, when the delay of the signal at both the node "e" and the node "f" is greater than the delay of the clock ck1 to be supplied to the logical block 40c, the clock ck1 is L level, that is, a logical evaluation of the logical block 40c is initiated during a pre-charging process at the node 3'. In addition, when each level at the node 1 and the node 2 is L level s the evaluation result of each f the logical blocks 40a and 40b in a preceding stage, a current "I" of a large amount indicated by the arrow flows through the circuit shown in FIG. 5. This introduces to decrease the operation speed of the circuit, and t cause an error operation.

In other words, when the delay of the clock ck0 is smaller than both the node "e" and the node "f" in the logical block 40c is smaller than that of the clock ck1 to be supplied to the logical block 40c, it is impossible to perform the circuit correctly because the following precharging for the node 3' is initiated before the evaluation of the logical block 40c is completed.

Furthermore, when a coupling capacity between the node "e" and the clock ck1, or between the node "f" and the clock ck1, or between the node "e" and the node "f" is large, the change of one of those signals is propagated to other signal. For example, this causes the occurrence of an error operation and also to reduce the operation speed of the circuit.

Accordingly, in order to achieve a higher speed operation of the logical circuit shown in FIG. 5, it is important to set the difference between the delay times of input signals correctly, for example, the difference between the delay time of the signal at the node "e" and the delay time of the clock ck1, the difference between the delay time of the clock ck1 and the delay time of the signal at the node "f", and the like.

The delay calculation section 113 in the circuit design apparatus performing the circuit design method according to the present invention calculates the delay timing in consideration of the coupling capacity between signal lines. When the delay time is larger than the coupling capacity, the delay improvement section 114 performs the delay improvement process such as the changing of the shield of wiring of signal lines and the changing of the layer of the wiring and the expanding the interval of wiring, and the like automatically. Thereby, it is possible to perform the circuit design process with high accuracy when compared with the conventional one, and also possible to extremely increase the efficiency of the circuit design process greatly.

Figure 6:
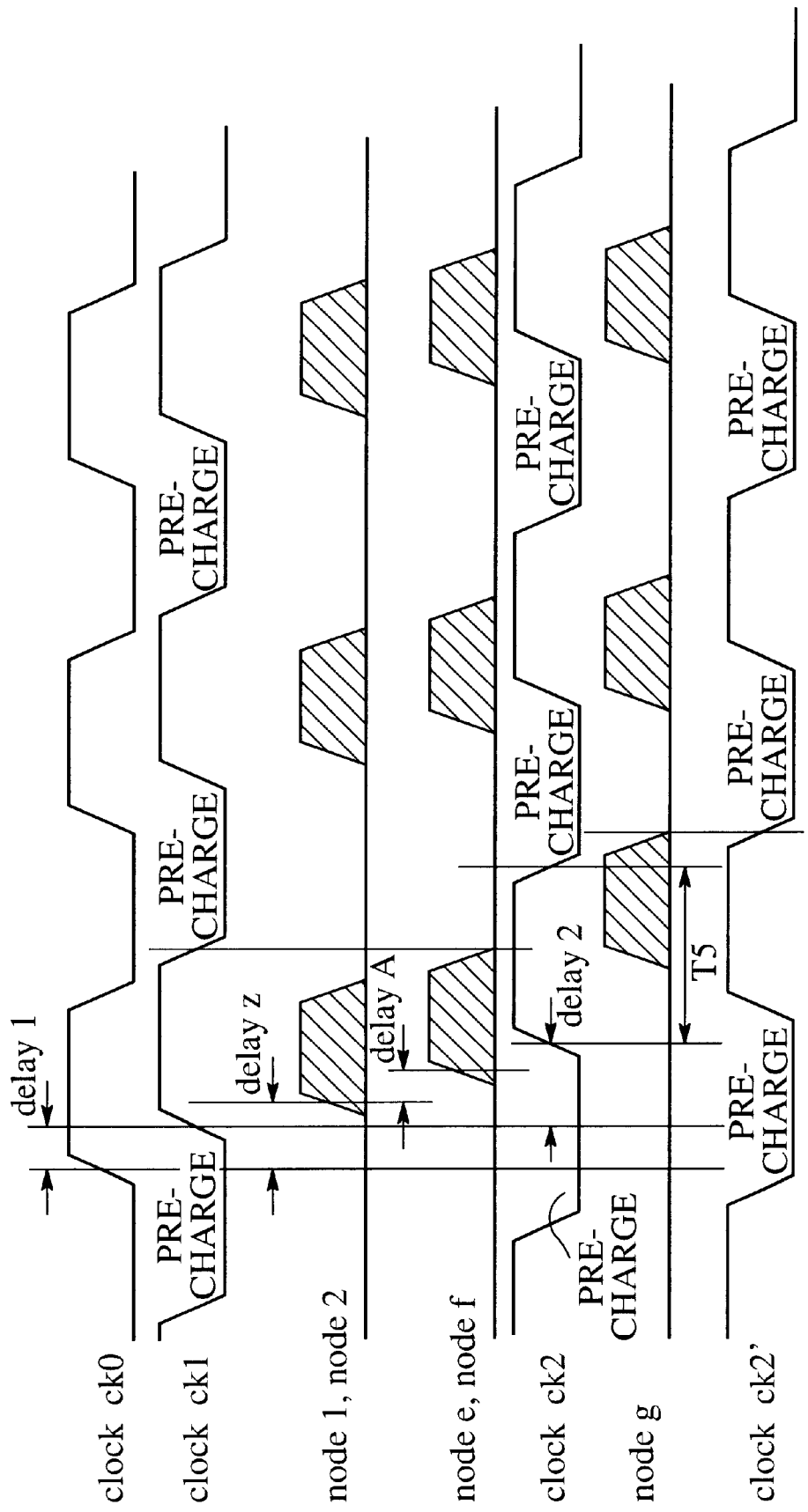
FIG. 6 is a timing chart showing the operation of the circuit designed by the circuit design method according to the preferred embodiment of the present invention.

FIG. 6 is a timing chart showing the operation of the circuit that is designed based on the circuit design method according to the preferred embodiment of the present invention. In FIG. 6, the reference characters "delay1", "delay2", "delayz", and "delayA" have the following meanings:

"delay1" designates a delay time of both wiring and a delay element 41 (as a buffer) located between the clock ck0 and the clock ck1;

"delay2" denotes a delay time of both wiring and a delay element 42 (as a buffer) located between the clock ck1 and the clock ck2;

"delayz" indicates a delay time of the logical blocks 40a and 40b when the clock ck0 an values of the nodes "a", the node "b", the node "c", and node "d" to which input signals are supplied are determined simultaneously; and "delayA" designates a delay time of wiring between the node "1" and the node "e", or a delay time of wiring between the node "1" and the node "e" and a slay time of a delay element placed between the wiring in order to adjust the delay times at the node "e" and the node "f".

As clearly shown in FIG. 6, the circuit that has been designed based on the circuit design method and the apparatus according to the present invention can operate correctly because the values "delayz" and "d layz+delayA" are greater than the value of "delay1" between the clock ck1 and the node "1" and between the clock ck1 and the node "2", and because the result of the evaluation of the logical block is not transferred to the following logical block during L level of the clock ck1 (during the pre-charging period).

On the other hand, there is a possibility to occur that the following pre-charging is initiated during the evaluation (see Timing T5 in FIG. 6) of the logical block 40c under the relationship between the clock ck2 and the node "g". However, the circuit design method an the apparatus of the present invention can solve the above problem by detecting the above state when the limitation condition is checked, and then by inserting an optimum delay element automatically in order to delay the delay time of the propagation of the clock ck2. The bottom portion in FIG. 6 designates a timing chart of the clock "ck2" when the delay element is inserted by the delay improvement section 114.

Figure 7:
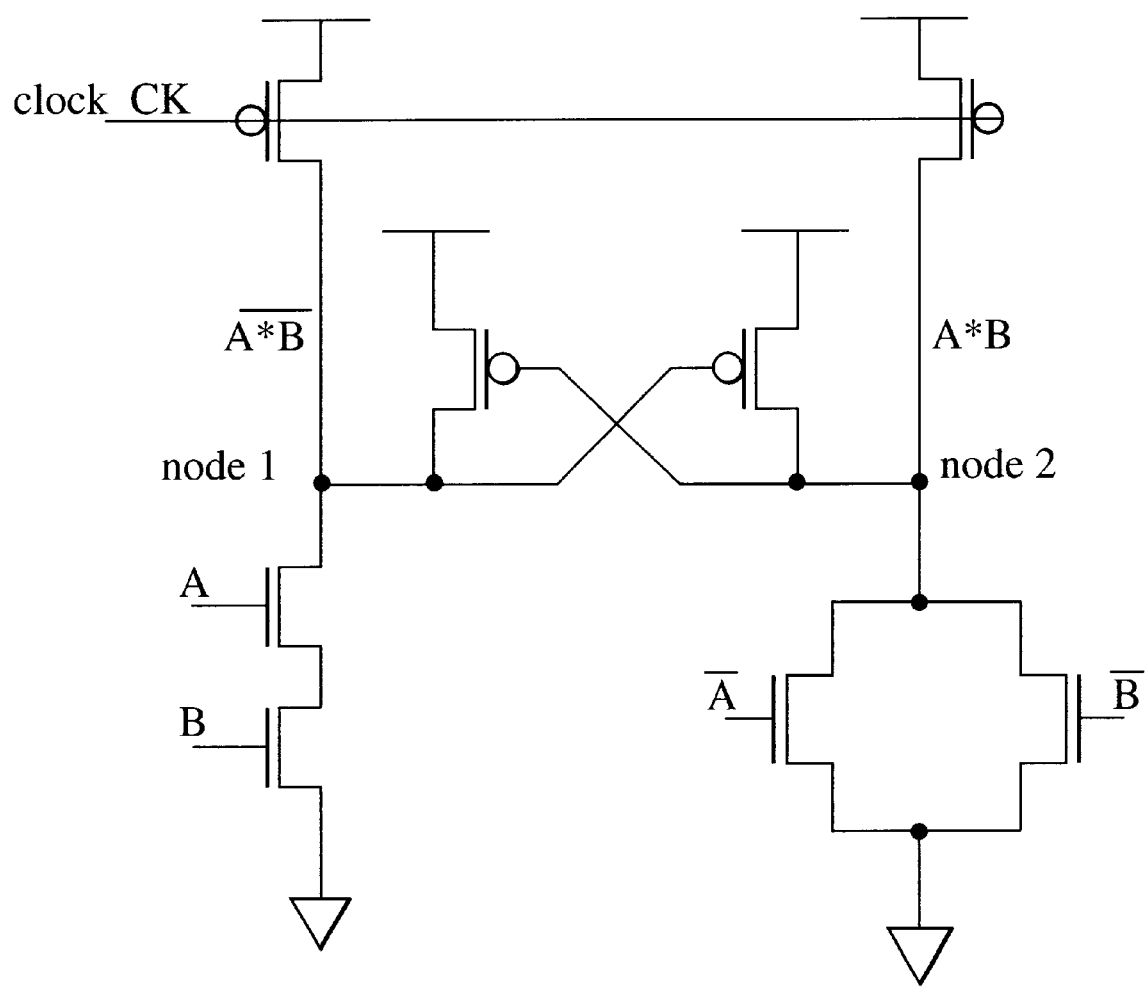
FIG. 7 is a diagram showing an example of a target circuit to be designed by the circuit design method according to the preferred embodiment of the present invention.

The circuit design method of the present invention can design a high-speed circuit, or example, a Dual-rail Logic circuit shown in FIG. 7.

FIG. 7 is a diagram showing the example of the target circuit to be designed by the circuit design method according to the preferred embodiment of the present invention.

In the circuit shown in FIG.7, in order to perform the pre-charging for the node "1" and the node "2" when the clock CK is L level, it must be necessary to adjust the timings among the clock CK and the input signals "A", "B", "/A", and "/B", like the example of the circuit shown in FIG. 5.

In the conventional circuit design process, the designer handles this adjustment by manual. On the contrary, because the circuit design method and the apparatus of the present invention can perform the automatic arrangement/wiring process by using the limitation conditions about the difference of delay times between the clock and the signals "A", "B", "/A", and "/B", it is possible to design the circuit incorporating high-speed logical blocks easily.

As set forth in detail, according to the circuit design method, the circuit design apparatus, and the circuit design program of the present invention, it is possible to easily design a circuit capable of operating with high speed and to extremely increase the efficiency of the circuit design work, because the target circuit is designed by performing the automatic arrangement/wiring in the circuit in order to set the difference between the delay times of the input signals within limitation conditions in consideration of the delay of each signal to be supplied to logical blocks in the circuit.

In addition, according to the circuit design method, the circuit design apparatus, and the circuit design program of the present invention, it is possible to design a high-speed circuit with high accuracy, because the circuit design is performed so that the delay time of a clock signal to be supplied to the logical blocks in the circuit is further delayed.

Furthermore, according to the semiconductor integrated circuit fabrication method of the present invention, it is possible to reduce the time period of the fabrication of the semiconductor integrated circuit and also to increase the efficiency of the fabrication process of the semiconductor integrated circuit, because the semiconductor integrated circuit is fabricated by using the circuit design information obtained by executing and designing the arrangement/wiring in the circuit in order to set the difference between the delay times of the input signals within limitation conditions in consideration of the delay of each signal to be supplied to logical blocks in the circuit.

While the above provides a full and complete disclosure of the preferred embodiments of the present invention, various modifications, alternate constructions and equivalents may be employed without departing from the scope of the invention. Therefore the above description and illustration should not be construed as limiting the scop of the invention, which is defined by the appended claims.

What is claimed is:

1. A circuit design apparatus for automatically determining an arrangement and wiring of logical blocks in a circuit by a computer system using circuit design information, comprising:

an arrangement/wiring section for determining the arrangement and wiring of the logical blocks in the circuit relative to both delay limitation information of input signals supplied to the logical blocks, and limitation conditions of a difference of delay times among a pre-charge control signal supplied to a corresponding one of the logical blocks and the input signals.

2. A circuit design apparatus according to claim 1, wherein the delay limitation information for the input signals is limitation information for a delay of each input signal, accounted for when the logical blocks are connected, and the limitation conditions of a difference of delay times among a pre-charge control signal supplied to the corresponding one of the logical blocks and the input signals are limitation conditions, each for a difference of delay times caused among the pre-charge control signal supplied to the corresponding one of the logical blocks and the wirings through which the corresponding input signals are supplied.

3. A circuit design apparatus according to claim 1, wherein the arrangement/wiring section determines the arrangement and the wiring of the logical blocks so that the transmission of the pre-charge control signal is delayed when compared with the transmission delay time of the input signal supplied to the corresponding one of the logical blocks by inserting a delay cell that is capable of delaying the transmission delay time of the pre-charge control signal.

4. A circuit design apparatus according to claim 2, wherein the arrangement/wiring section determines the arrangement and the wiring of the logical blocks so that the transmission delay time of the pre-charge control signal is delayed when compared with the transmission delay time of the input signal supplied to the corresponding one of the logical blocks by inserting a delay cell for delaying the transmission delay time of the pre-charge control signal.

5. A circuit design apparatus according to claim 1, further comprising:

a delay calculation section for calculating the delay value of the input signal supplied to the corresponding one of the logical blocks by referring to arrangement/wiring information of the logical blocks and a coupling capacity; and a delay improvement section for improving the transmission delay time of the input signal supplied to the corresponding one of the logical blocks by reducing the coupling capacity when the delay value calculated does not account for the corresponding limitation condition.

6. A circuit design apparatus according to claim 3, further comprising:

a delay calculation section for calculating the delay value of the input signal supplied to the corresponding one of the logical blocks by referring to arrangement/wiring information of the logical blocks and a coupling capacity; and a delay improvement section for improving the transmission delay time of the input signal supplied to the corresponding one of the logical blocks by reducing the coupling capacity when the delay value calculated does not account for the corresponding limitation condition.

7. A circuit design method of automatically determining an arrangement and wiring of logical blocks in a circuit by a computer system and using circuit design information, comprising the steps of:

inputting delay limitation information of input signals supplied to the logical blocks and limitation conditions of a difference of delay times among a pre-charge control signal to be supplied to the corresponding one of the logical blocks and the input signals; and determining the arrangement and the wiring of the logical blocks in the circuit so that both the delay limitation information and the limitation conditions are accounted.

8. A circuit design method according to claim 7, wherein in the step of inputting the delay limitation information and the limitation conditions, the delay limitation information for the input signals are limitation information for a delay of each input signal, are accounted for when the logical blocks are connected, and the limitation conditions of a difference of delay times among a pre-charge control signal supplied to the corresponding one of the logical blocks and the input signals are limitation conditions, each for a difference of delay times caused among the pre-charge control signal supplied to the corresponding one of the logical blocks and the wirings through which the corresponding input signals are supplied.

9. A circuit design method according to claim 7, wherein
in the step of performing the arrangement and wiring of the logical blocks, the arrangement and the wiring of the logical blocks are determined so that the transmission of the pre-charge control signal is delayed when compared with the transmission delay time of the input signal supplied to the corresponding one of the logical blocks by inserting a delay cell that is capable of delaying the transmission delay time of the pre-charge control signal.

10. A circuit design method according to claim 8, wherein
in the step of performing the arrangement and wiring of the logical blocks, the arrangement and the wiring of the logical blocks are determined so that the transmission of the pre-charge control signal is delayed when compared with the transmission delay time of the input signal supplied to the corresponding one of the logical blocks by inserting a delay cell delaying the transmission delay time of the pre-charge control signal.

11. A circuit design method according to claim 7, further comprising the steps of:
calculating the delay value of the input signal supplied to the corresponding one of the logical blocks by referring to arrangement/wiring information of the logical blocks and a coupling capacity; and
improving the transmission delay time of the input signal supplied to the corresponding one of the logical blocks by reducing the coupling capacity when the delay value calculated does not account for the corresponding limitation condition.

12. A circuit design method according to claim 9, further comprising the steps of:
calculating the delay value of the input signal supplied to the corresponding one of the logical blocks by referring to arrangement/wiring information of the logical blocks and a coupling capacity; and
improving the transmission delay time of the input signal supplied to the corresponding one of the logical blocks by reducing the coupling capacity when the delay value calculated does not satisfy the corresponding limitation condition.

13. A circuit design program to be used for executing a circuit design method of automatically determining an arrangement and wiring of logical blocks in a circuit by a computer system using circuit design information, comprising the programs of:
inputting delay limitation information of input signals supplied to the logical blocks and limitation conditions about a difference of delay times among a pre-charge control signal supplied to a corresponding one of the logical blocks and the input signals; and
determining the arrangement and the wiring of the logical blocks in the circuit so that both the delay limitation information and the limitation conditions are accounted.

14. A circuit design program according to claim 13, wherein
in the program for inputting the delay limitation information and the limitation conditions, the delay limitation information for the input signals are limitation information for a delay of each input signal, accounted for when the logical blocks are connected, and the limitation conditions of a difference of delay times among a pre-charge control signal supplied to the corresponding one of the logical blocks and the input signals are limitation conditions, each for a difference of delay times caused among the pre-charge control signal supplied to the corresponding one of the logical blocks and the wirings through which the corresponding input signals are supplied.

15. A circuit design program according to claim 13, wherein
in the program for performing the arrangement and wiring of the logical blocks, the arrangement and the wiring of the logical blocks are determined so that the transmission of the pre-charge control signal is delayed when compared with the transmission delay time of the input signal supplied to the corresponding one of the logical blocks by inserting a delay cell for delaying the transmission delay time of the pre-charge control signal.

16. A circuit design program according to claim 14, wherein
in the program for performing the arrangement and wiring of the logical blocks, the arrangement and the wiring of the logical blocks are determined so that the transmission of the pre-charge control signal is delayed when compared with the transmission delay time of the input signal supplied to the corresponding one of the logical blocks by inserting a delay cell for delaying the transmission delay time of the pre-charge control signal.

17. A circuit design program according to claim 13, further comprising the programs of:
calculating the delay value of the input signal supplied to the corresponding one of the logical blocks by referring to arrangement/wiring information of the logical blocks and a coupling capacity; and
improving the transmission delay time of the input signal supplied to the corresponding one of the logical blocks by reducing the coupling capacity when the delay value calculated does not account for the corresponding limitation condition.

18. A circuit design program according to claim 15, further comprising the programs of:
calculating the delay value of the input signal supplied to the corresponding one of the logical blocks by referring to arrangement/wiring information of the logical blocks and a coupling capacity; and
improving the transmission delay time of the input signal supplied to the corresponding one of the logical blocks by reducing the coupling capacity when the delay value calculated does not satisfy the corresponding limitation condition.

19. A semiconductor integrated circuit fabrication method of fabricating a semiconductor integrated circuit, comprising the steps of:
inputting circuit design information obtained by automatically determining an arrangement and wiring of logical blocks by a computer system so that the following delay limitation information and limitation conditions are accounted:
the delay limitation information of input signals to be supplied to the logical blocks;
the limitation conditions of a difference of delay times among a pre-charge control signal supplied to a corresponding one of the logical blocks and the input signals; and
fabricating the semiconductor integrated circuit by performing the arrangement and wiring of the logical blocks based on the circuit design information.

* * * * *